United States Patent
Kobayashi

(10) Patent No.: US 9,756,719 B2
(45) Date of Patent: Sep. 5, 2017

(54) ELECTRONIC EQUIPMENT

(71) Applicant: KYOCERA Document Solutions Inc., Osaka (JP)

(72) Inventor: Yasuyoshi Kobayashi, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 15/141,722

(22) Filed: Apr. 28, 2016

(65) Prior Publication Data

US 2016/0323989 A1  Nov. 3, 2016

(30) Foreign Application Priority Data

Apr. 28, 2015 (JP) ................................. 2015-091354

(51) Int. Cl.
*H05K 1/02* (2006.01)
*H05K 9/00* (2006.01)

(52) U.S. Cl.
CPC ......... *H05K 1/0216* (2013.01); *H05K 9/0022* (2013.01); *H05K 2201/10371* (2013.01); *H05K 2201/10409* (2013.01)

(58) Field of Classification Search
CPC ............... H05K 1/0216; H05K 9/0022; H05K 2201/10409
USPC .................................................. 361/816, 818
See application file for complete search history.

(56) References Cited

U.S. PATENT DOCUMENTS

| | | | | |
|---|---|---|---|---|
| 2002/0097353 A1* | 7/2002 | Lee | ..................... | G02F 1/13452 349/58 |
| 2010/0309644 A1* | 12/2010 | Choi | ................... | G02F 1/13452 361/818 |
| 2011/0026234 A1* | 2/2011 | Kim | ..................... | H05K 1/0236 361/800 |
| 2012/0098020 A1* | 4/2012 | Fukuda | .................... | H05K 1/02 257/98 |
| 2012/0320558 A1* | 12/2012 | Foster | ................. | H05K 1/0218 361/818 |
| 2013/0003333 A1* | 1/2013 | Toyao | .................. | H05K 1/0236 361/777 |
| 2015/0327410 A1* | 11/2015 | Sherrer | ................. | C23C 24/082 361/818 |
| 2015/0338082 A1* | 11/2015 | Hu | ........................... | F21K 9/23 362/373 |

(Continued)

FOREIGN PATENT DOCUMENTS

JP    H11-097814 A    4/1999

*Primary Examiner* — Hoa C Nguyen
(74) *Attorney, Agent, or Firm* — Hawaii Patent Services; Nathaniel K. Fedde; Kenton N. Fedde

(57) ABSTRACT

Provided is an electronic equipment which can effectively reduce unexpected unnecessary radiation. In the electronic equipment, a circuit board on which a noise source that is an electronic part becoming a source of the unnecessary radiation is mounted and a circuit board mounting plate on which the circuit board is mounted are disposed substantially parallel with a space put therebetween. In the electronic equipment, a partition plate is disposed, which functions as a noise reflecting surface on which an indirect wave emitted from the noise source towards the circuit board mounting plate is reflected. Further, an indirect wave dispersing member is disposed between the circuit board and the circuit board mounting plate so as to block spacing between the noise source and the partition plate.

10 Claims, 12 Drawing Sheets

(56) References Cited

U.S. PATENT DOCUMENTS

| | | | |
|---|---|---|---|
| 2015/0345727 A1* | 12/2015 | Herrmann | F21S 48/1109 362/509 |
| 2016/0174420 A1* | 6/2016 | Cochrane | H05K 9/0009 361/818 |
| 2016/0262259 A1* | 9/2016 | Ueyama | G06F 1/16 |

* cited by examiner

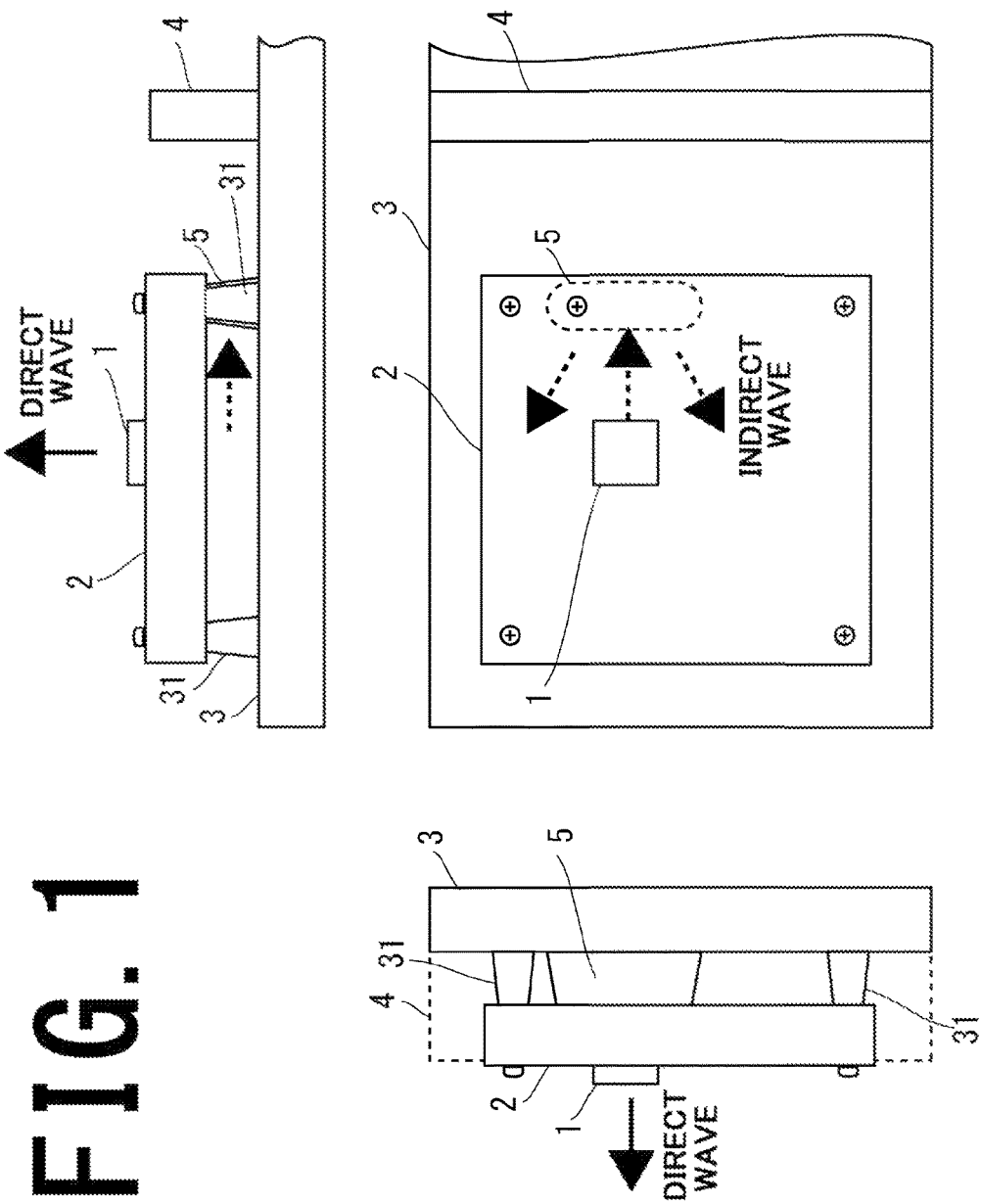

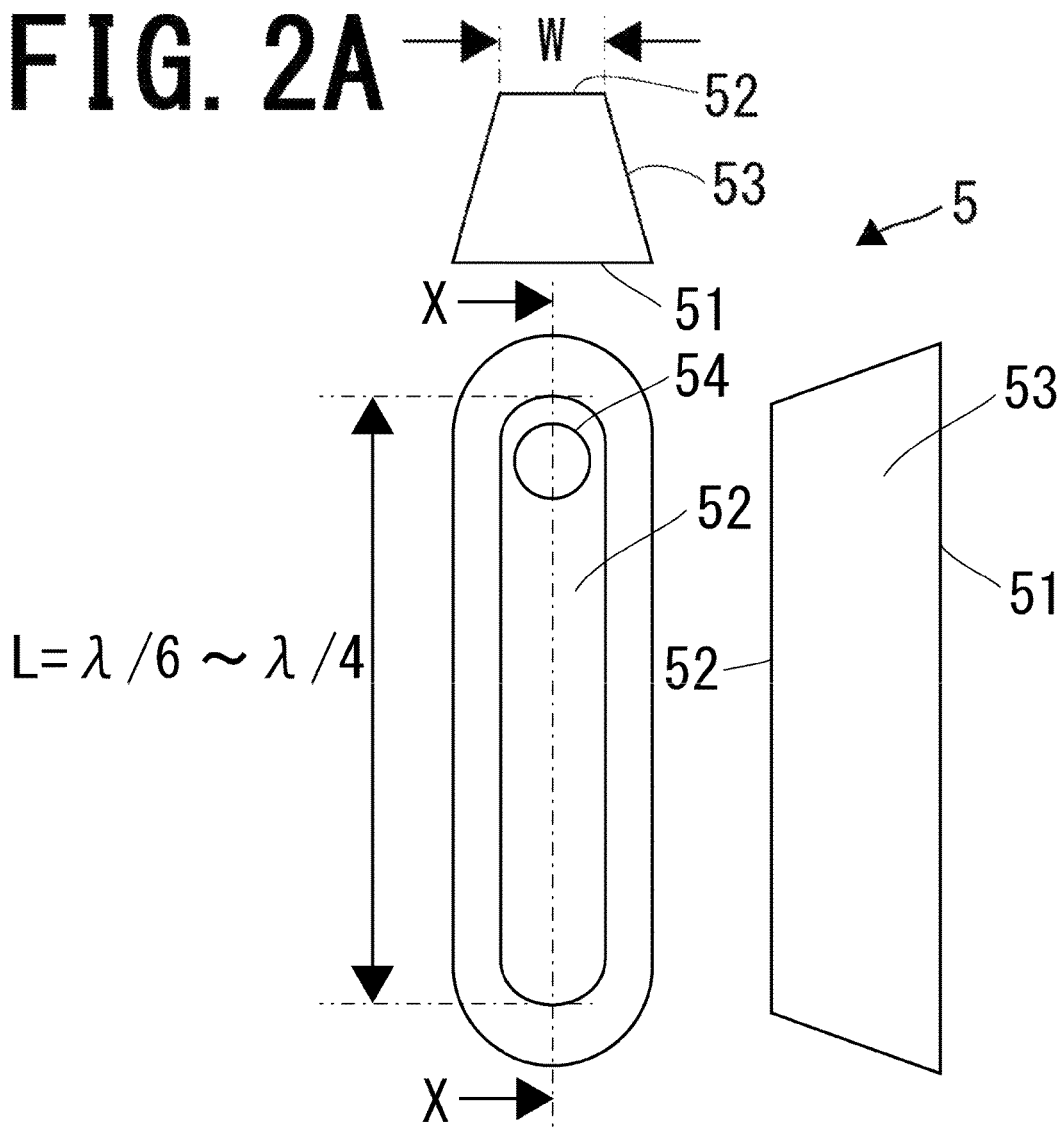

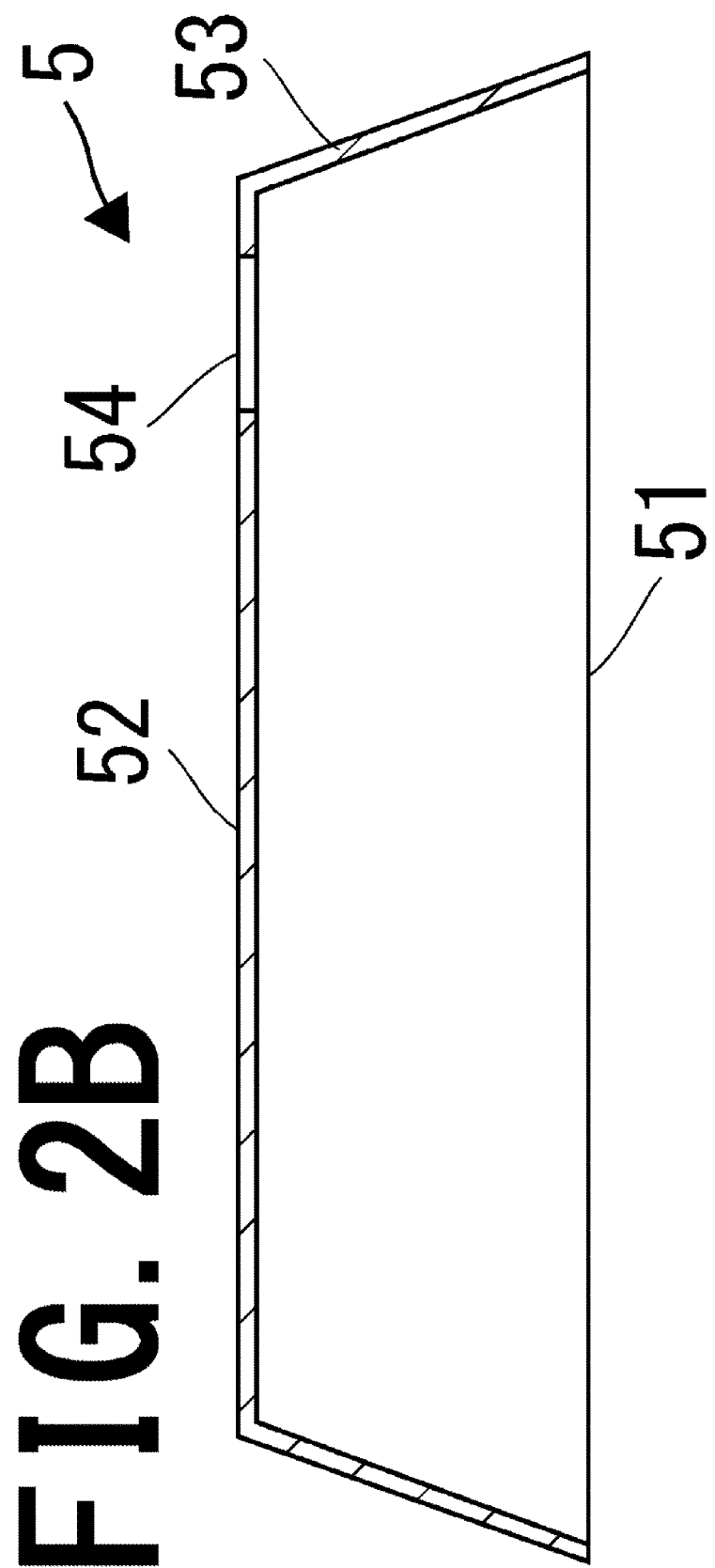

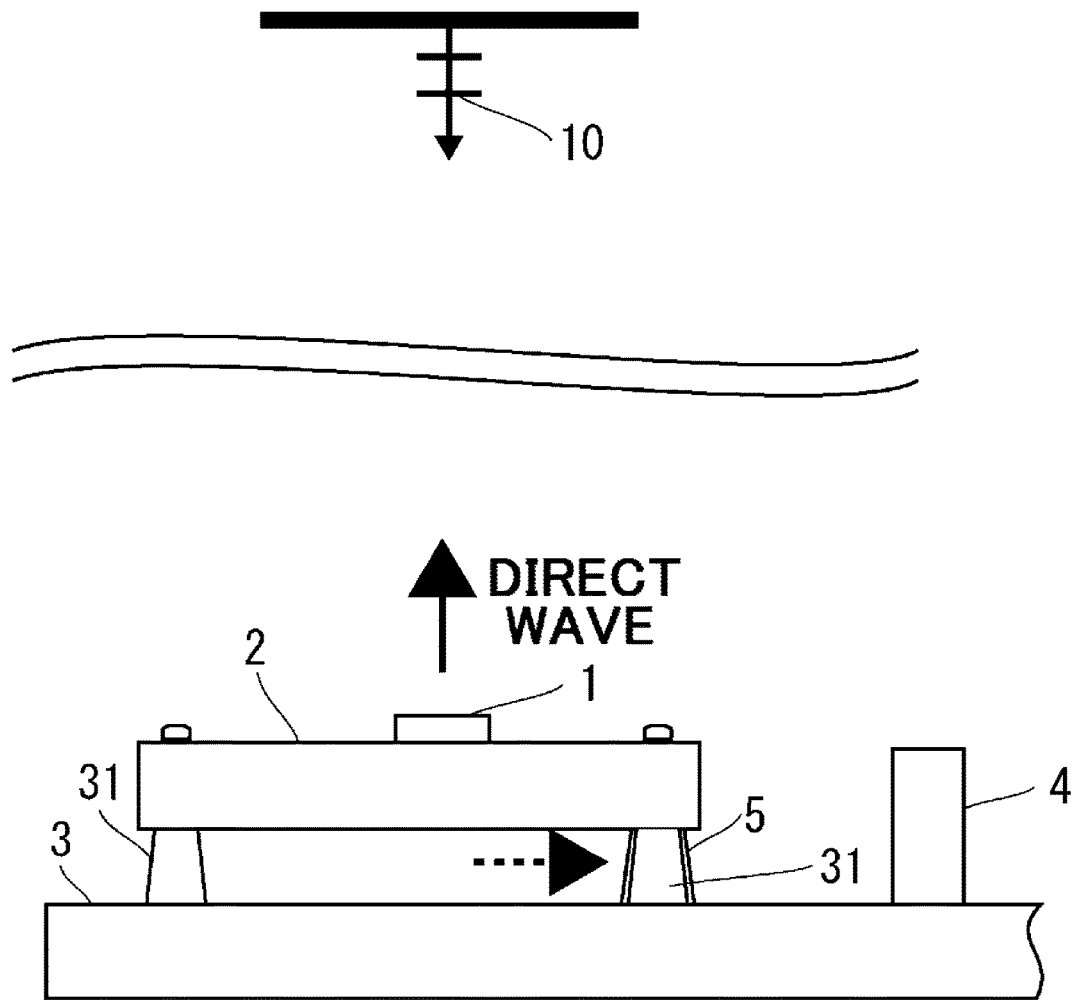

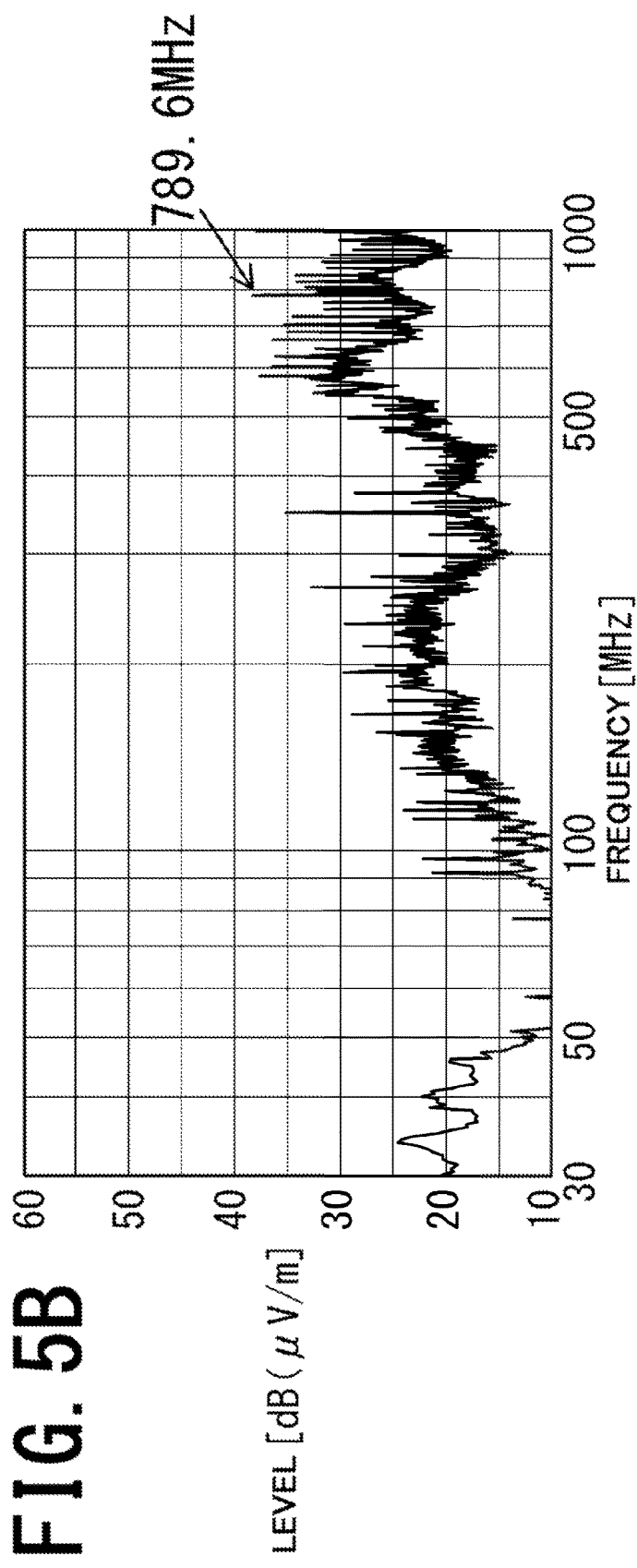

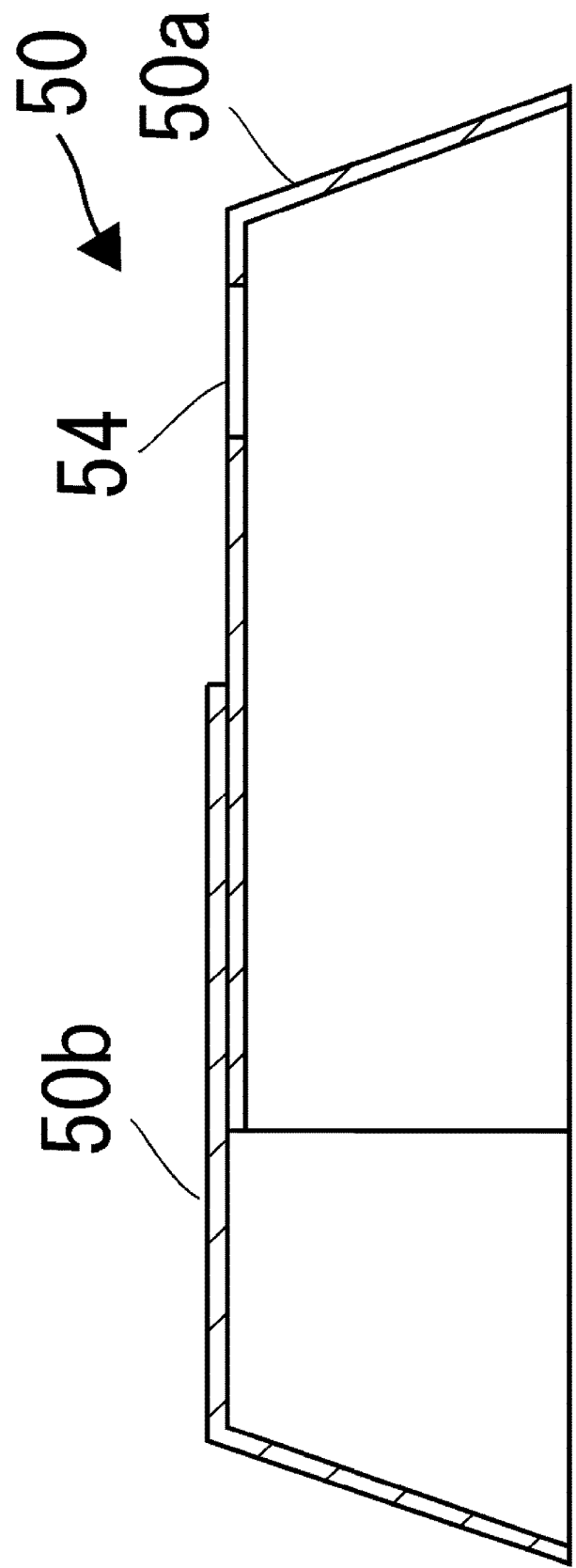

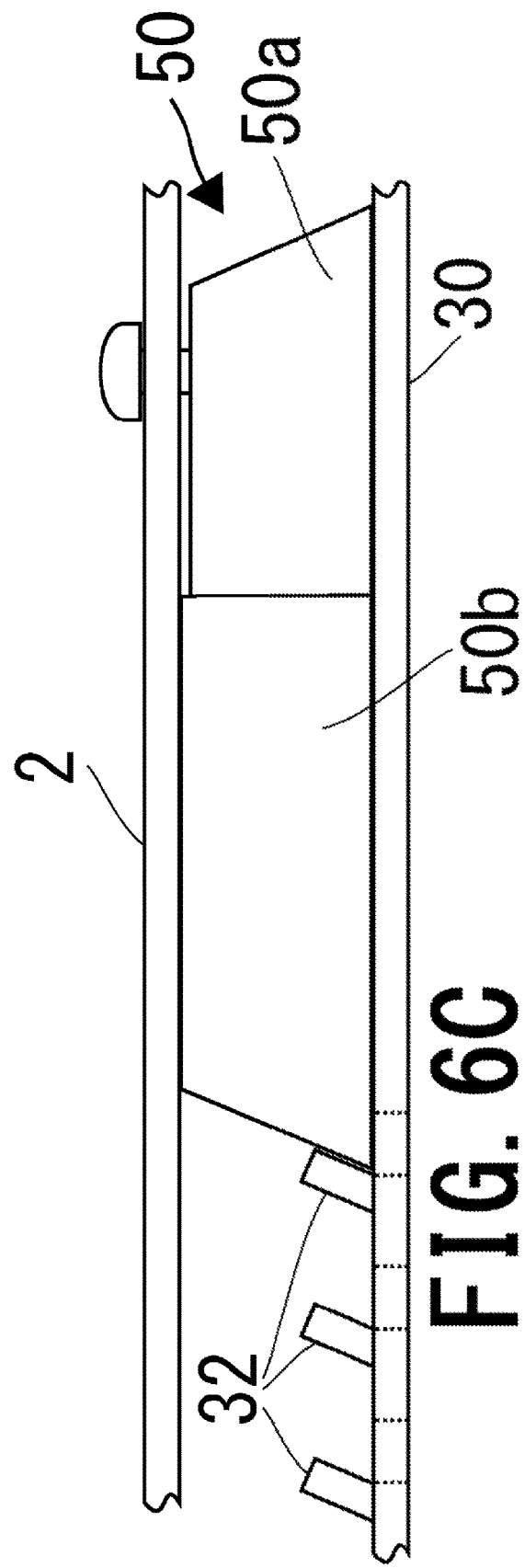

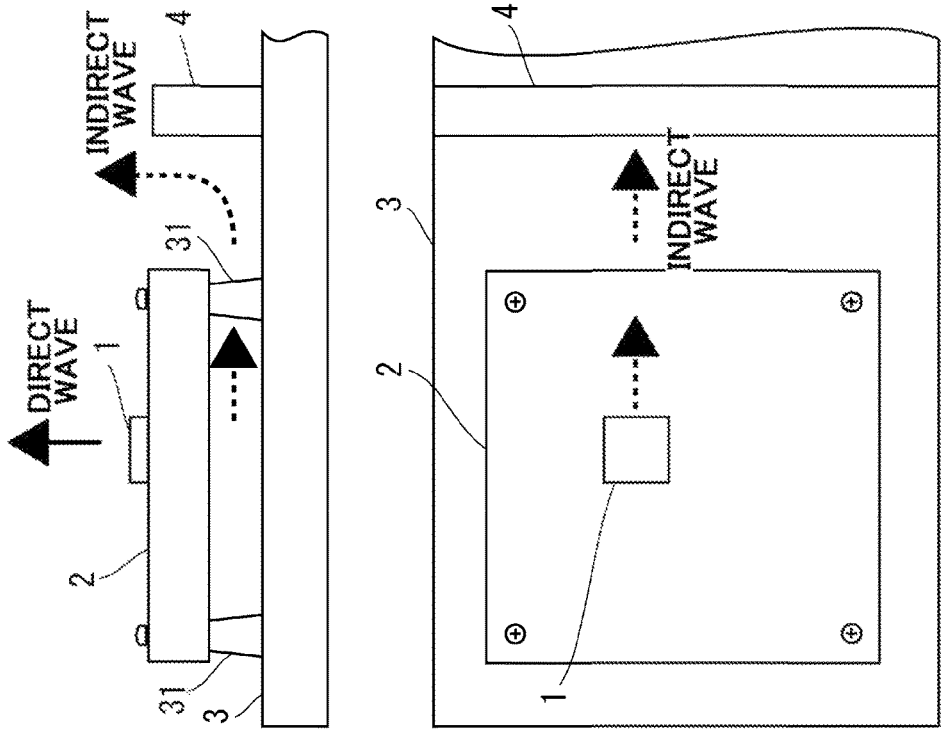
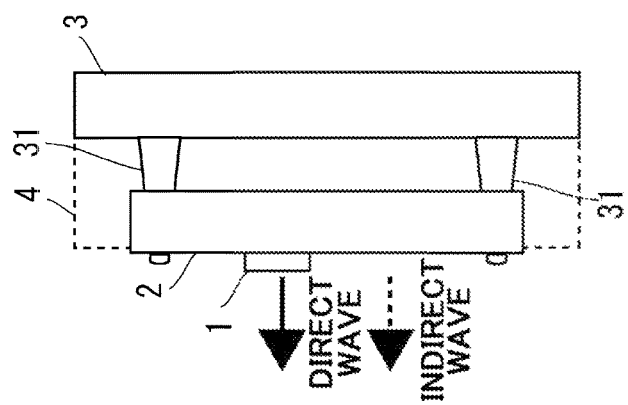
FIG. 7
PRIOR ART

ELECTRONIC EQUIPMENT

INTRODUCTION BY REFERENCE

This application is based on and claims the benefit of priority from Japanese Patent Application No. 2015-091354 filed on Apr. 28, 2015, the entire contents of which are hereby incorporated by reference.

BACKGROUND

The present disclosure relates to an electronic equipment on which an electronic part that becomes a source of unnecessary radiation (hereinafter, referred to as a noise source) is mounted.

In recent years, there has become a problem that other electronic equipment is damaged by unnecessary radiation emitted from, for example, an image forming apparatus such as a copying machine or a computer. To address this problem, it is necessary to suppress an intensity level of the unnecessary radiation emitted from the electronic device to a level less than a standard value. Radiation from a noise source can be grasped by simulation or an actual measurement. However, even from a noise source that emits unnecessary radiation whose intensity level should be a level less than a standard value by the simulation or the actual measurement, there can be a case where when the noise source 1 is actually mounted on the electronic equipment, that is, as shown in FIG. 7, a circuit board 2 on which a noise source 1 is mounted is mounted on a circuit board mounting plate 3, unnecessary radiation emitted from the noise source 1 exceeds an expected intensity level. In this case, in a typical technique, this problem has been addressed so far by adopting a shield structure in which a shield is placed around the noise source 1 and the circuit board 2 to reduce an influence of unnecessary radiation emitted from the noise source 1.

In the typical technique, however, it is necessary to provide a configuration having a large volume for the noise source, and it eventually results in an increase in size of the whole electronic equipment. Additionally, the typical technique brings about not only increased costs involved in shielding the noise, but also the increased number of working man-hours.

SUMMARY

According to an aspect of the present disclosure, there is provided an electronic equipment including a circuit board on which an electronic part becoming a source of an unnecessary radiation is mounted and a circuit board mounting plate on which the circuit board is mounted, the circuit board and the circuit board mounting plate being disposed substantially parallel with a space put therebetween, the electronic equipment comprising: a reflector that is disposed in the electronic equipment to function as a noise reflecting surface on which an indirect wave emitted from the electronic part towards the circuit board mounting plate side is reflected; and an indirect wave dispersing member that is disposed in a space defined between the circuit board and the circuit board mounting plate so as to block spacing between the electronic part and the noise reflecting surface.

BRIEF DESCRIPTION OF THE DRAWINGS

FIG. 1 shows a three-plane view showing a configuration of one embodiment of electronic equipment according to the present disclosure.

FIGS. 2A and 2B are a three-plane view and a sectional view showing a configuration of an indirect wave dispersing member shown in FIG. 1.

FIGS. 4A and 4B are views showing measuring examples to measure an intensity level of unnecessary radiation.

FIGS. 5A and 5B are graphs showing measuring results obtained from the measuring examples shown in FIGS. 4A, and 4B, respectively.

FIGS. 6A, 6B and 6C are a plan view, a sectional view and a side view, respectively, showing a configuration of another embodiment of an indirect wave dispersing member.

FIG. 7 is a three-plane view showing a configuration of electronic equipment according to a typical technique.

DETAILED DESCRIPTION

Figure 3:
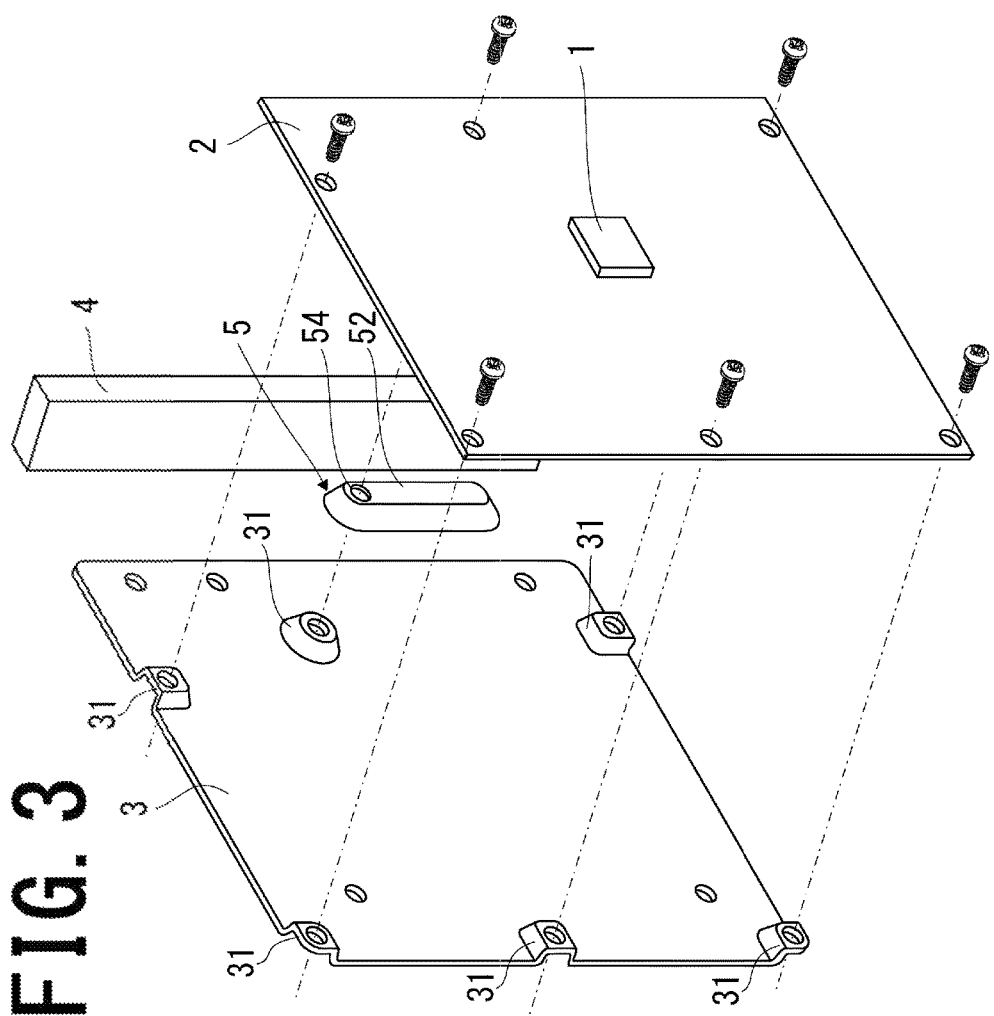
FIG. 3 is an exploded perspective view showing a mounting example of the indirect wave dispersing member shown in FIG. 1.

Next, one embodiment of the present disclosure will be described specifically with reference to the accompanying drawings.

It is noted that similar elements are given similar reference numerals throughout the drawings.

An electronic equipment of the present embodiment, as shown in FIG. 1, includes an indirect wave dispersing member 5 provided in a space defined between a circuit board 2 on which a noise source 1 is mounted and a circuit board mounting plate 3 on which the circuit board 2 is mounted so as to block clearance between the noise source 1 and a partition plate 4.

The circuit board 2 is a printed circuit board on a surface of which a plurality of electronic parts including the noise source 1 are mounted to form an electronic circuit. The circuit board mounting plate 3 is made up of a metallic conductor such as a galvanized steel sheet (SGCC, Steel Galvanized Cold Commercial, defined by the JIS Standard), an electrogalvanized steel sheet (SGCC, Steel Electrolytic Cold Commercial, defined by the JIS Standard), and aluminum. The circuit board 2 is mounted on the circuit board mounting plate 3 by screwing to a screw fastening part 31 projectingly formed in a vertical direction on the circuit board mounting plate 3 and is disposed substantially parallel with a space put relative to the circuit board mounting plate 3. Alternatively, the circuit board 2 may be mounted on the circuit board mounting plate 3 via a spacer (not shown) in place of the screw fastening part 31. The noise source 1 includes a switching power supply parts. The switching power supply parts are, for example, a processor such as a CPU or an ASIC or a converter.

The partition plate 4 is made of a metallic conductor made of aluminum, for example. Here, the purpose of providing the partition plate 4 is to prevent exertion of an influence of unnecessary radiation emitted from the noise source 1 on other electronic parts provided within the electronic equipment. The partition plate 4 is disposed substantially perpendicularly with a space put relative to the circuit board 2 from the circuit board 2. Thus, the partition plate 4 disposed in this way functions as a noise reflecting surface that reflects unnecessary radiation.

The unnecessary radiation is composed of a direct wave emitted directly from a front surface side of the circuit board 2, that is, in an opposite direction from the circuit board mounting plate 3 and an indirect wave emitted towards the circuit board mounting plate 3 side. In a typical electronic equipment, as shown in FIG. 7, the indirect wave arrives at a partition plate 4 after passing through a space defined between a circuit board 2 and a circuit board mounting plate 3. In FIG. 7, solid line arrows denote the direct wave, and dotted line arrows denote the indirect wave. Then, the indirect wave arrived at the partition plate 4 is reflected on the partition plate 4 and is synthesized with the direct wave. In the event that the direct wave is synthesized with the indirect wave in this way, it sometimes happens that unnecessary radiation exceeds an expected intensity level.

Then, as shown in FIG. 1, the present disclosure is configured to attenuate the indirect wave by an indirect wave dispersing member 5 to thereby strive for noise dispersion. In FIG. 1, solid line arrows denote the direct wave, and dotted line arrows denote the indirect wave.

As shown in FIG. 2A, the indirect wave dispersing member 5 has a truncated cone shape, in the form of a rounded rectangle, which is comprised of two parallel lines where a lower bottom 51 that is a lower surface and an upper bottom 52 that is an upper surface are of equal length and two semicircles. Then, the indirect wave dispersing member 5 is mounted so that the lower bottom 51 contacts the circuit board mounting plate 3 and the upper bottom 52 contacts the circuit board 2. The indirect dispersing plate 5 is formed by applying press working on a metallic sheet, and as shown in FIG. 2B, the lower bottom 51 has an opening. FIG. 2B is a sectional view of the indirect wave dispersing member 5 taken along a cutting line X-X in FIG. 2A. Further, a screw hole 54 through which a screw for mounting the circuit board 2 on the circuit mounting plate 3 passes is formed in one of semicircular portions of the upper bottom 52.

The indirect wave dispersing member 5 is disposed so as to block spacing between the noise source 1 and the partition plate 4. In the indirect wave dispersing member 5, the indirect wave is dispersed by a conical surface 53, thereby preventing the indirect wave from arriving at the partition plate 4. Since the indirect wave dispersing member 5 has the truncated cone shape in which the lower bottom 51 contacts the circuit board mounting plate 3, the indirect wave is reflected by the conical surface 53 towards the circuit board 2 and is then attenuated by the circuit board 2.

The length L of the indirect wave dispersing member 5 (the length of the upper bottom 52) is set to a range from $\lambda/6$ or more to $\lambda/4$ or less relative to a wavelength $\lambda$ of a frequency to be reduced out of the unnecessary radiation. This prevents the indirect wave dispersing member 5 from resonating and acting as an antenna.

The width W of the upper bottom 52 is set to 3 mm or more so that the upper bottom 52 is prevented from being brought into line contact with the circuit board 2. In the present embodiment, since the screw hole 54 is formed in the upper bottom 52, the width W of the upper bottom 52 is set to be equal to or larger than a diameter of a screw.

As shown in FIG. 3, the indirect dispersing member 5 can be mounted so as to block the spacing between the noise source 1 and the partition plate 4 by using a screw fastening part 31 formed between the noise source 1 and the partition plate 4. In the present embodiment, the screw fastening part 31 having a truncated cone shape is formed between the noise source 1 and the partition plate 4. The screw fastening part 31 is fitted in the semicircular portion of the indirect wave dispersing part 5 where the screw hole 54 is formed and the circuit board 2 is fastened to the indirect wave dispersing member 5 with a screw. By doing so, the indirect wave dispersing member 5 is positioned and fixed in a space defined between the circuit board 2 and the circuit board mounting plate 3. In this way, the present disclosure is configured to mount the indirect wave dispersing member 5 by using an existing fastening part (the screw fastening part 31 and the screw) for mounting the circuit board 2 on the circuit board mounting plate 3. This configuration eliminates the need to newly add a fastening part, and therefore reduces an increase in the number of assembling man-hours. Additionally, the indirect wave dispersing member 5 also serves as an alternative of a board support for the circuit board 2, thereby preventing deflection of the circuit board 2 when a connector is inserted thereinto. This prevents the circuit board 2 from being damaged due to the deflection.

Figure 4A:
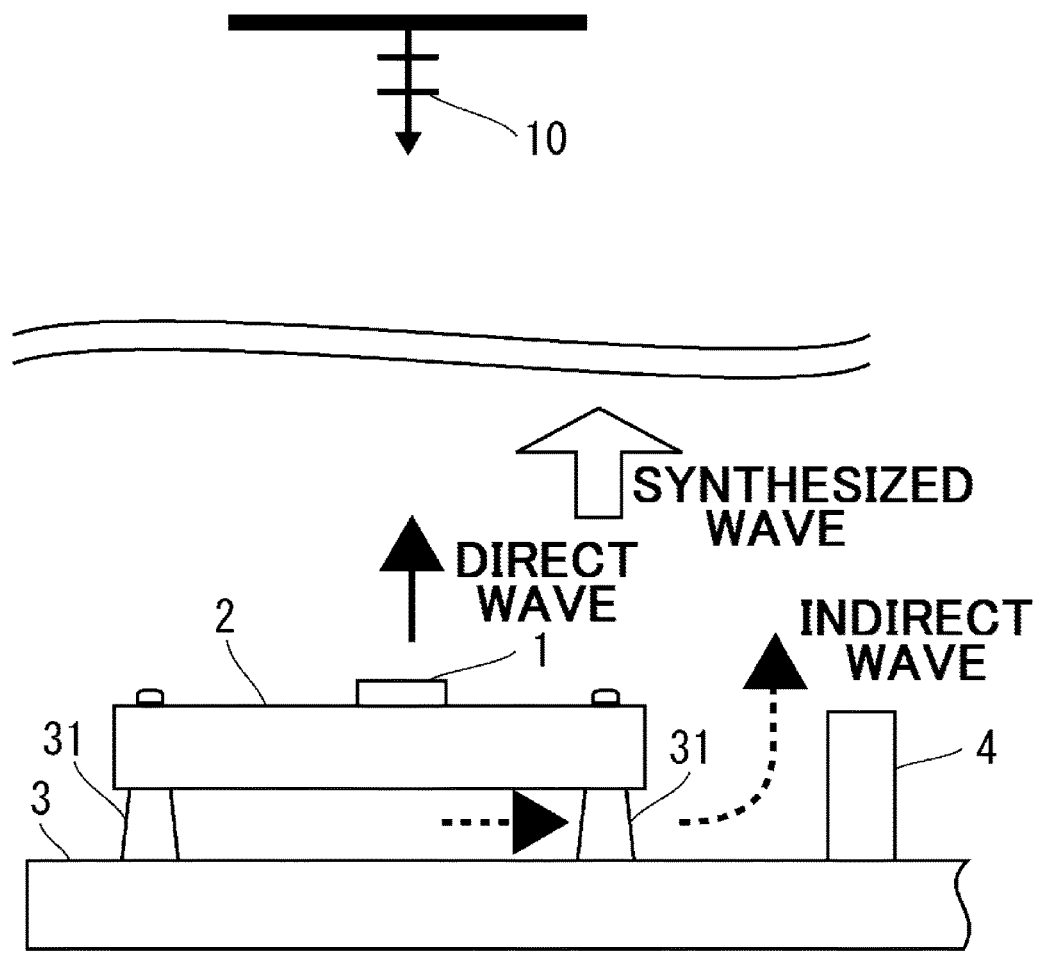
Figure 5A:
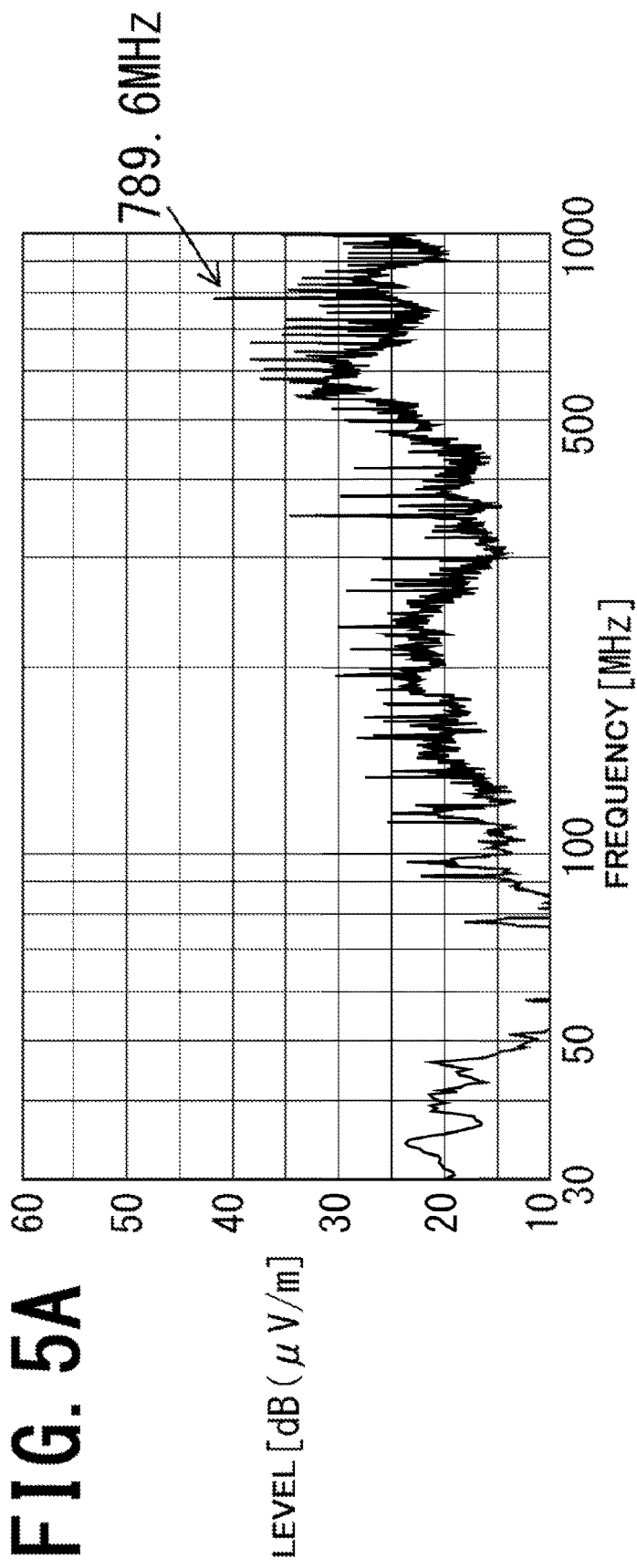

An antenna 10 is arranged in an electronic equipment in which there is not provided the typical indirect wave dispersing member 5 apart by three meters from a circuit board 2 as shown in FIG. 4A. Then, an intensity level ($\mu$dB/m) for every frequency of unnecessary radiation is measured. As a result, according to the simulation, the intensity level of the unnecessary radiation emitted from the noise source 1 should have fallen within a range less than 40 ($\mu$dB/m) in any of the frequencies. However, as shown in FIG. 5A, the measurement result shows that the intensity level in a frequency of 789.6 [MHz] is 44.1 ($\mu$dB/m), which exceeds an expected value.

Then, the antenna 10 is arranged in a vertical direction of the electronic equipment of the present embodiment in which there is provided the indirect wave dispersing member 5 apart by three meters from the circuit board 2 as shown in FIG. 4B. Subsequently, an intensity level ($\mu$dB/m) for every frequency of the unnecessary radiation is measured. In this case, a frequency to be reduced is 789.6 [MHz], and a wavelength is $\lambda \approx 379.9$ [mm]. Consequently, since $\lambda/6 \approx 63.3$ [mm] and $\lambda/4 \approx 95.0$ [mm], the length L of the indirect wave dispersing member 5 is set to 70 [mm], which falls within the range of $\lambda/6$ to $\lambda/6$. As a result, as shown in FIG. 5A, the intensity level at the frequency of 789.6 [MHz] can be reduced to a level less than 40 ($\mu$dB/m).

It is presumed that the reason why the intensity level exceeds the expected value at the frequency of 789.6 [MHz] in the typical electronic equipment is that the direct wave is synthesized with the indirect wave reflected by the partition plate 4. In contrast, in the electronic equipment of the present embodiment, it is considered that the indirect wave is dispersed by the indirect wave dispersing member 5 and prevents the indirect wave from being reflected on the partition plate 4, which reduces the unnecessary radiation at the frequency of 789.6 [MHz].

In the present embodiment, the indirect wave dispersing member 5, which is the separate member, is mounted in the space defined between the circuit board 2 and the circuit board mounting plate 3. Alternatively, a configuration may be taken in which the indirect wave dispersing member 5 is previously formed on the circuit board mounting plate 3 if a frequency to be reduced is known in advance.

Figure 6A:
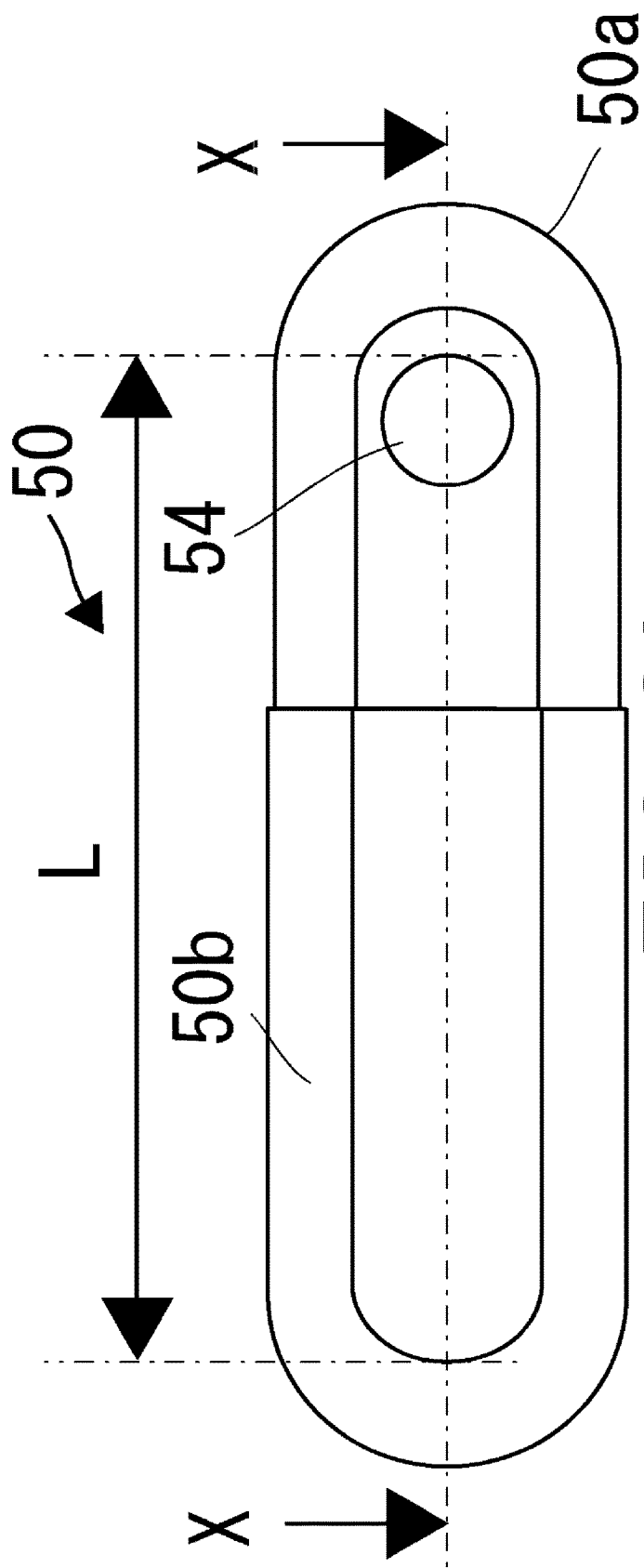

Further, the indirect wave dispersing member 5 needs to change its length L according to the frequency to be reduced. Then, as shown in FIGS. 6A and 6B, it is preferable to adopt an indirect wave dispersing member 50 having a configuration in which the indirect wave dispersing member 5 is cut in a width direction, and made up of a first member 50a and a second member 50b. FIG. 6B is a sectional view of the indirect wave dispersing member 50 taken along a cutting line X-X in FIG. 6A. In the indirect wave dispersing member 50, the second member 50b can be slid in a lengthwise direction relative to the first member 50a to thereby change its length L. Consequently, the length L of the indirect dispersing member 50 can be set to the length corresponding to the frequency to be reduced. In a case where the indirect wave dispersing member 50 is adopted, as shown in FIG. 6C, it should be configured so that the circuit board mounting plate 30 is used in which a plurality of projecting positioning members 32 are provided to engage with the second member 50b, and that the length L can be changed by selecting a positioning member 32 to be engaged with the second member 50. Alternatively, for example, a notch may be formed on the circuit board mounting plate 30 and use the notch piece as the positioning member 32.

In the present embodiment, it is configured such that the indirect wave dispersing member 5, which is the separate member, is mounted in the space defined between the circuit board 2 and the circuit board mounting plate 3. However, instead, the whole or part of the indirect wave dispersing member 5 may be made of the same member as the circuit board mounting plate 3. Namely, the indirect wave dispersing member 5 can be formed so as to project in a vertical direction from the circuit board mounting plate 3 by applying press working on the circuit board mounting member 3. Further, in a case where the indirect wave dispersing member 50 is used which is made up of the first member 50a and the second member 50b, either of the first member 50a or the second member 50b can be made of the same member as the circuit board mounting plate 3.

Thus, as described heretofore, in the electronic equipment according to the present embodiment, the circuit board 2 on which the noise source 1 that is the electronic part becoming a source of the unnecessary radiation is mounted and the circuit board mounting plate 3 on which the circuit board 2 is mounted are disposed substantially parallel with a space put therebetween. Further, in the electronic equipment, the partition plate (the reflector) 4 is disposed, which functions as the noise reflecting surface on which the indirect wave emitted from the noise source 1 is reflected towards the circuit board mounting plate 3 side. Furthermore, the indirect wave dispersing member 5 is provided in the space defined between the circuit board 2 and the circuit board mounting member 3 so as to block the spacing between the noise source 1 and the partition plate 4.

This configuration allows the indirect wave to be dispersed by the indirect wave dispersing member 5, which prevents the indirect wave from arriving at the partition plate 4. This effectively reduces unexpected unnecessary radiation.

Further, in the present embodiment, the length L of the indirect wave dispersing member 5 is set to the range from $\lambda/6$ or more to $\lambda/4$ or less relative to the wavelength $\lambda$ of the frequency to be reduced out of the unnecessary radiation.

This configuration allows the indirect wave dispersing member 5 to be prevented from acting as the antenna that resonates with the frequency to be reduced. Needless to say, the reason why the length L of the indirect wave dispersing member 5 is set to the range from $\lambda/6$ or more to $\lambda/4$ or less is to prevent the resonance of the indirect wave dispersing member 5 and the generation of natural vibrations.

Further, in the present embodiment, the indirect wave dispersing member 5 has the truncated cone shape, and the lower bottom 51 contacts the circuit board mounting plate 3, and the upper bottom 52 contacts the circuit board 2, respectively.

This configuration allows the indirect wave to be reflected by the conical surface 53 towards the circuit board 2, which attenuates the indirect wave by the circuit board 2.

Furthermore, in the present embodiment, the indirect wave dispersing member 5 is the metallic plate whose upper surface (the upper bottom 52) contacts the circuit board 2 and lower surface (the lower bottom 51) is formed as an opening. Then, the screw hole through which a screw for mounting the circuit board 2 on the circuit board mounting plate 3 passes is formed in the upper surface (the upper bottom 52).

This configuration allows the indirect wave dispersing member 5 to be fixed by using the fastening part (the screw fastening part 31 and the screw) where the circuit board 2 is mounted on the circuit board mounting plate 3. This obviates the need for newly adding a new fastening part and suppresses an increase in the number of assembling man-hours. Further, the indirect wave dispersing member 5 serves as an alternative of the board support of the circuit board 2. This eliminates the occurrence of deflection of the circuit board 2 when a connector is inserted thereinto, which prevents the circuit board 2 from being damaged by the deflection.

Additionally, in the present embodiment, the indirect wave dispersing member 50 is made up of the first member 50a and the second member 50b. Thus, the length L of the indirect wave dispersing member 50 can be changed by sliding the second member 50b in the lengthwise direction relative to the first member 50a.

This configuration enables the length L of the indirect wave dispersing member 50 to be changed according to the frequency to be reduced.

The present disclosure is not necessarily limited to the aforesaid embodiments, and it is obvious to those skilled in the art that the embodiments may appropriately be modified within the technical idea of the present disclosure. Further, the numbers, positions, and configurations of the constituent members described in the embodiments are not necessarily limited thereto, and hence, any suitable numbers, positions and configurations may be adopted in carrying out the present disclosure.

What is claimed is:

1. An electronic equipment including a circuit board on which an electronic part becoming a source of an unnecessary radiation is mounted and a circuit board mounting plate on which the circuit board is mounted, the circuit board and the circuit board mounting plate being disposed substantially parallel with a space put therebetween, the electronic equipment comprising:
   a reflector that is disposed in the electronic equipment to function as a noise reflecting surface on which an indirect wave emitted from the electronic part towards the circuit board mounting plate side is reflected; and
   an indirect wave dispersing member that is disposed in a space defined between the circuit board and the circuit board mounting plate so as to block spacing between the electronic part and the noise reflecting surface.

2. The electronic equipment according to claim 1, wherein the length of the indirect wave dispersing member is set to a range from $\lambda/6$ or more to $\lambda/4$ or less relative to a wavelength $\lambda$ of the unnecessary radiation to be reduced.

3. The electronic equipment according to claim 1, wherein the indirect wave dispersing member has a truncated cone shape whose lower bottom contacts the circuit board mounting plate and upper bottom contacts the circuit board.

4. The electronic equipment according to claim 1, wherein the indirect wave dispersing member is a metallic plate whose upper surface contacts the circuit board and lower surface contacting the circuit board mounting plate is formed as an opening, and
   a screw hole through which a screw for mounting the circuit board on the circuit board mounting plate passes is formed on the upper surface.

5. The electronic equipment according to claim 1, wherein
the indirect wave dispersing member is made up of a first
member and a second member, and the length of the
indirect wave dispersing member can be changed by
sliding the second member in a lengthwise direction
relative to the first member.

6. The electronic equipment according to claim 5, wherein
the circuit board mounting plate comprises a plurality of
positioning members that are projectingly formed and
engages with the second member.

7. The electronic equipment according to claim 6, wherein
the positioning members can be selected according to a
frequency to be reduced.

8. The electronic equipment according to claim 6, wherein
the positioning members are a notch piece formed on the
circuit board mounting plate.

9. The electronic equipment according to claim 1, wherein
at least part of the indirect wave dispersing member is
made up of part of the circuit board mounting plate.

10. The electronic equipment according to claim 1, wherein
the reflector is made of a metallic conductor.

* * * * *